(12) United States Patent
Chavali et al.

(10) Patent No.: US 10,980,129 B2
(45) Date of Patent: Apr. 13, 2021

(54) ASYMMETRIC ELECTRONIC SUBSTRATE AND METHOD OF MANUFACTURE

(71) Applicant: Intel Corporation, Santa Clara, CA (US)

(72) Inventors: Sri Chaitra Jyotsna Chavali, Chandler, AZ (US); Amruthavalli Pallavi Alur, Tempe, AZ (US); Wei-Lun Kane Jen, Chandler, AZ (US); Sriram Srinivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/819,899

(22) Filed: Mar. 16, 2020

(65) Prior Publication Data
US 2020/0221577 A1 Jul. 9, 2020

Related U.S. Application Data

(62) Division of application No. 16/228,027, filed on Dec. 20, 2018, now Pat. No. 10,624,213.

(51) Int. Cl.
*H05K 1/02* (2006.01)
*H05K 1/09* (2006.01)
(Continued)

(52) U.S. Cl.
CPC .......... *H05K 3/0097* (2013.01); *H05K 1/115* (2013.01); *H05K 3/007* (2013.01); *H05K 3/0023* (2013.01);
(Continued)

(58) Field of Classification Search
CPC ... H05K 1/02; H05K 1/09; H05K 1/11; H05K 1/16; H05K 1/18; H05K 3/00; H05K 3/02;
(Continued)

(56) References Cited

U.S. PATENT DOCUMENTS 4,882,454 A * 11/1989 Peterson .............. H05K 1/0206
174/252
4,963,697 A * 10/1990 Peterson .............. H05K 1/0207
174/252
(Continued)

OTHER PUBLICATIONS

"U.S. Appl. No. 16/228,027, Non Final Office Action dated Aug. 29, 2019", 8 pgs.
(Continued)

*Primary Examiner* — Xiaoliang Chen
(74) *Attorney, Agent, or Firm* — Schwegman Lundberg & Woessner, P.A.

(57) ABSTRACT

An asymmetric electronic substrate and method of making the substrate includes forming a first layer on each opposing major surface of a removable carrier layer, the first layer being a routing layer, simultaneously laminating the first layers, and building up subsequent layers on layers previously formed and laminated on the removable carrier layer iteratively. The subsequent layers including routing layers and a core layer formed on each side of the removable carrier layer, the core layer including through holes having a larger gauge than through holes included in the routing layers. A number of layers on a first side of the core layer, between the core layer and the carrier layer, is different than a number of layers on a second side of the core layer. The carrier layer is removed to produce two asymmetric substrates, each asymmetric substrate including one of the at least one core layers.

10 Claims, 8 Drawing Sheets

(51) Int. Cl.
*H05K 1/11* (2006.01)
*H05K 1/16* (2006.01)
*H05K 1/18* (2006.01)
*H05K 3/00* (2006.01)
*H05K 3/02* (2006.01)
*H05K 3/04* (2006.01)
*H05K 3/10* (2006.01)
*H05K 3/20* (2006.01)
*H05K 3/30* (2006.01)
*H05K 3/36* (2006.01)
*H05K 3/40* (2006.01)
*H05K 3/42* (2006.01)
*H05K 3/44* (2006.01)
*H05K 3/46* (2006.01)

(52) U.S. Cl.
CPC ......... *H05K 3/0047* (2013.01); *H05K 3/0055* (2013.01); *H05K 3/421* (2013.01); *H05K 3/429* (2013.01); *H05K 3/4644* (2013.01); H05K 2201/0959 (2013.01); H05K 2201/09509 (2013.01); H05K 2203/025 (2013.01)

(58) Field of Classification Search
CPC .. H05K 3/04; H05K 3/10; H05K 3/20; H05K 3/30; H05K 3/36; H05K 3/40; H05K 3/42; H05K 3/44; H05K 3/46
USPC ........ 174/264, 250, 255, 260, 262; 156/247, 156/248; 428/212, 221; 29/820, 846, 29/852
See application file for complete search history.

(56) References Cited

U.S. PATENT DOCUMENTS

| | | | | |
|---|---|---|---|---|
| 5,841,099 | A * | 11/1998 | Owen | C23C 14/046 219/121.69 |
| 5,854,123 | A | 12/1998 | Sato et al. | |
| 6,323,439 | B1 * | 11/2001 | Kambe | H05K 3/0038 174/255 |
| 9,345,142 | B2 * | 5/2016 | Moon | H05K 3/4644 |
| 9,839,124 | B2 * | 12/2017 | Kohiki | H05K 3/025 |
| 10,187,983 | B2 * | 1/2019 | Kohiki | H05K 1/09 |
| 10,624,213 | B1 | 4/2020 | Chavali et al. | |
| 2001/0023532 | A1 * | 9/2001 | Fujii | H01L 21/6835 29/830 |
| 2001/0027875 | A1 * | 10/2001 | Kim | H05K 3/4623 174/255 |
| 2001/0045419 | A1 * | 11/2001 | Dunsky | H05K 3/0038 219/121.76 |
| 2002/0152611 | A1 * | 10/2002 | Tung | H05K 3/4602 29/846 |
| 2004/0178492 | A1 * | 9/2004 | Tsukamoto | H01L 23/49822 257/690 |
| 2005/0236177 | A1 * | 10/2005 | Inagaki | H05K 1/09 174/255 |
| 2006/0094136 | A1 * | 5/2006 | Borden | G01N 21/95692 438/16 |
| 2006/0243478 | A1 * | 11/2006 | Inagaki | H01L 23/50 174/255 |
| 2007/0029106 | A1 * | 2/2007 | Kato | H01L 23/49838 174/255 |
| 2007/0119541 | A1 | 5/2007 | Kawabata et al. | |
| 2007/0121273 | A1 * | 5/2007 | Yamamoto | H05K 1/0231 361/306.2 |
| 2007/0261234 | A1 * | 11/2007 | Song | H05K 3/381 29/829 |
| 2007/0266559 | A1 * | 11/2007 | Lee | H05K 3/4652 29/852 |
| 2008/0041619 | A1 * | 2/2008 | Lee | H01L 24/24 174/260 |
| 2008/0277150 | A1 * | 11/2008 | Takashima | H01L 21/4857 174/260 |
| 2009/0145651 | A1 * | 6/2009 | Yoshino | C25D 5/10 174/263 |
| 2009/0242248 | A1 * | 10/2009 | Sohn | B32B 27/20 174/258 |
| 2010/0083490 | A1 | 4/2010 | Kawabata et al. | |
| 2010/0096078 | A1 * | 4/2010 | Nakamura | H05K 3/46 156/247 |
| 2010/0126860 | A1 * | 5/2010 | Srinivasan | B01L 3/502792 204/450 |
| 2010/0314037 | A1 * | 12/2010 | Liu | H01L 21/6835 156/248 |
| 2011/0053318 | A1 * | 3/2011 | Hu | H01L 24/81 438/113 |
| 2012/0205039 | A1 * | 8/2012 | Yamada | H05K 3/4682 156/247 |
| 2012/0328857 | A1 * | 12/2012 | Yajima | H05K 3/4644 428/212 |
| 2013/0161073 | A1 * | 6/2013 | Lee | H05K 3/4644 174/251 |
| 2014/0020931 | A1 * | 1/2014 | Kobayashi | H01L 23/49822 174/250 |
| 2014/0311780 | A1 * | 10/2014 | Shizuno | H05K 1/0269 174/258 |
| 2014/0338955 | A1 * | 11/2014 | Park | H05K 3/4644 174/250 |
| 2015/0041053 | A1 * | 2/2015 | Kiwanami | H05K 3/0097 156/247 |
| 2015/0096173 | A1 * | 4/2015 | Yu | H05K 3/4644 29/853 |
| 2016/0113120 | A1 * | 4/2016 | Ishihara | H05K 3/4682 174/262 |
| 2016/0128197 | A1 * | 5/2016 | Standing | H05K 3/32 361/717 |
| 2017/0339783 | A1 * | 11/2017 | Stahr | H01L 23/5387 |
| 2017/0339784 | A1 * | 11/2017 | Zluc | H05K 1/189 |
| 2018/0310408 | A1 * | 10/2018 | Hamada | H02M 3/00 |

OTHER PUBLICATIONS

"U.S. Appl. No. 16/228,027, Notice of Allowance dated Dec. 4, 2019", 9 pgs.
"U.S. Appl. No. 16/228,027, Response filed Nov. 20, 2019 to Non-Final Office Action dated Aug. 29, 2019", 7 pgs.
"U.S. Appl. No. 16/228,027, Response filed Aug. 20, 2019 to Restriction Requirement dated Jun. 21, 2019", 7 pgs.
"U.S. Appl. No. 16/228,027, Restriction Requirement dated Jun. 21, 2019", 7 pgs.

* cited by examiner

ASYMMETRIC ELECTRONIC SUBSTRATE AND METHOD OF MANUFACTURE

PRIORITY

This application is a Division of U.S. patent application Ser. No. 16/228,027, filed Dec. 20, 2018, which is incorporated by reference herein in its entirety.

TECHNICAL FIELD

The disclosure herein relates generally to an asymmetric electronic substrate with an unequal number of layers above and below a core, and a method of manufacture.

BACKGROUND ART

Electronic substrates conventionally provide for routing traces that allow for electronic signals to be passed between and among electronic chips that are coupled to the substrate. The routing traces are embedded in an insulator, such as a dielectric. At the center of the electronic substrate is a core that conventionally includes through holes with relatively large amounts of conductor material in order to provide power storage and delivery as well as inductance in the system, embedded in a strong insulator not necessarily utilized elsewhere in the substrate.

DESCRIPTION OF THE EMBODIMENTS

Figure 1:
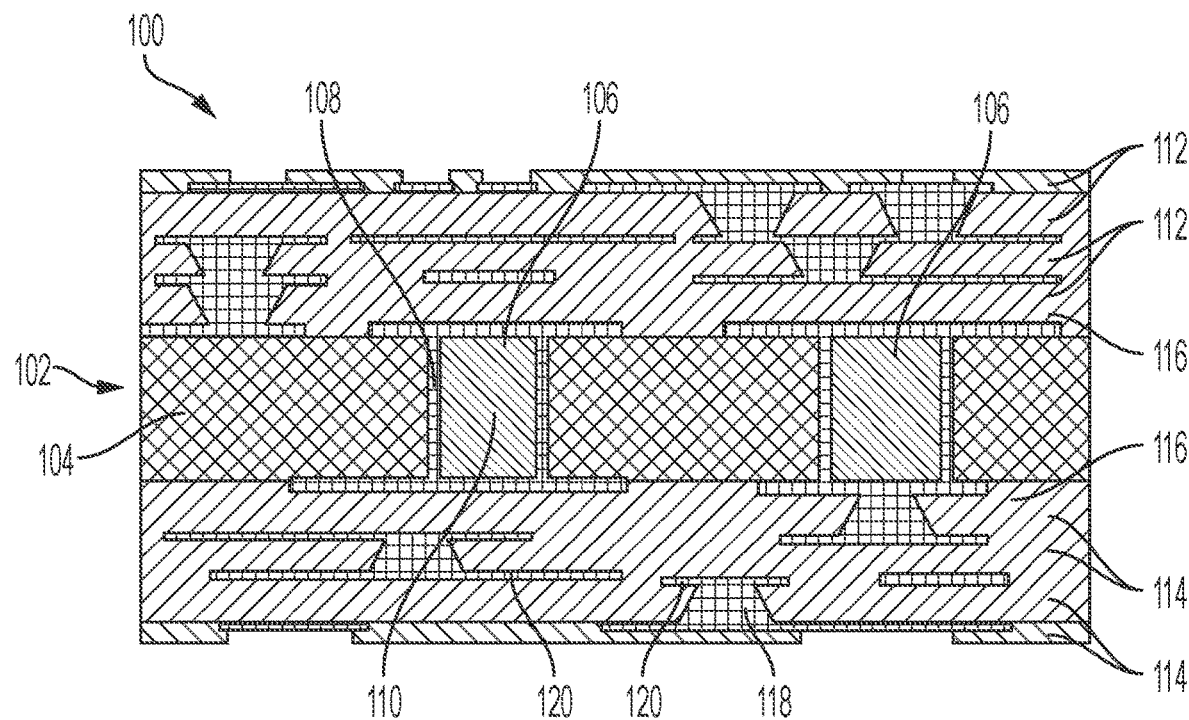
FIG. 1 is a side view of an of a prior art, symmetric electronic substrate, in an example embodiment.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In conventional electronic substrates, the number of routing layers on each side of the core is equal. This fact is owing to the conventional manufacturing process of electronic substrates, in which the core is formed and then routing layers are simultaneously built onto both resultant major surfaces. The simultaneous application of layers stems from the constraints of the lamination process; if only one side is laminated, the structure as a whole may tend to warp. By laminating both sides of the structure simultaneously, even application of heat provides reduces a likelihood of warping or other damage to the resultant substrate. The result is a symmetric electronic substrate, having an equal number of routing layers on each side of the core.

However, in various circumstances, having the same number of layers on each side of the core may be unnecessary, or even disadvantageous. While the routing layers on the side of the electronic substrate facing the dies secured to the substrate provide for the routing between and among the dies, i.e., the topside of the substrate, the routing layers on the bottom side of the substrate for input and output from the substrate tend to route far fewer signals than the topside layers. Thus, while the topside routing layers may, for instance, require nine routing layers, the bottom side may only require one or two routing layers. However, because the manufacturing processes for electronic substrates requires symmetric application of routing layers to the core, the bottom side may inherently have as many layers as is required for the topside, even if those layers are unnecessary.

Moreover, the bottom side conventionally includes electronic components such as capacitors, the proximity of which to the associated dies may be advantageous over relatively greater distances. However, the inclusion of unnecessary routing layers in the bottom side may result in the capacitors be positioned farther away from the dies than may be the case if the bottom side included fewer routing layers.

Asymmetric electronic substrates, and a method of making the asymmetric electronic substrates, have been developed that have an unequal number of routing layers on the two sides of the core. By incorporating a removable carrier layer into the manufacturing process, two asymmetric substrates may be formed simultaneously, which may as much as double the output of an electronic substrate manufacturing process relative to the manufacture of symmetric electronic substrates. Moreover, the specific processes which may be utilized in the manufacturing process owing to the inclusion of the removable carrier may provide for smaller components and a tighter pitch between components, as well as higher yield than may be achieved with symmetric electronic substrate manufacturing processes.

FIG. 1 is a side view of an of a prior art, symmetric electronic substrate 100, in an example embodiment. A core layer 102 includes a rigid material 104 and large gauge through holes 106 through the rigid material 104. The through holes 106 are plated with a conductive material 108, such as copper, and filled with a plug 110. The symmetric electronic substrate 100 further includes topside routing layers 112 and bottom side routing layers 114, the number of topside routing layers 112 being equal to the number of bottom side routing layers 114. Each routing layer 112, 114 includes a laminated dielectric 116 in which through holes are drilled and filled with a conductive material 118 and with conductive traces 120 positioned on the top or bottom of the dielectric 116.

As described herein, in the conventional manufacturing process for symmetric electronic substrates includes iteratively and sequentially applying one layer 112, 114 on each side of the core 102 simultaneously. Thus, the first topside layer 112(1) and the first bottom side layer 114(1) are both applied to an opposing major surface the core 102 and laminated simultaneously so that the application of heat to the symmetric electronic substrate 100 is even on both sides, preventing warping and damage. After the first layers 112(1), 114(1) have been applied to the exposed major surfaces of the core 102, then the second layers 112(2), 114(2) are applied to the exposed major surfaces of the first layers 112(1), 114(1), respectively, and laminated simultaneously. That process is iteratively repeated until the desired number of topside layers 112 and bottom side layers 114 are achieved, with the number top side layers 112 and bottom side layers 114 necessarily being the same.

Figure 2:
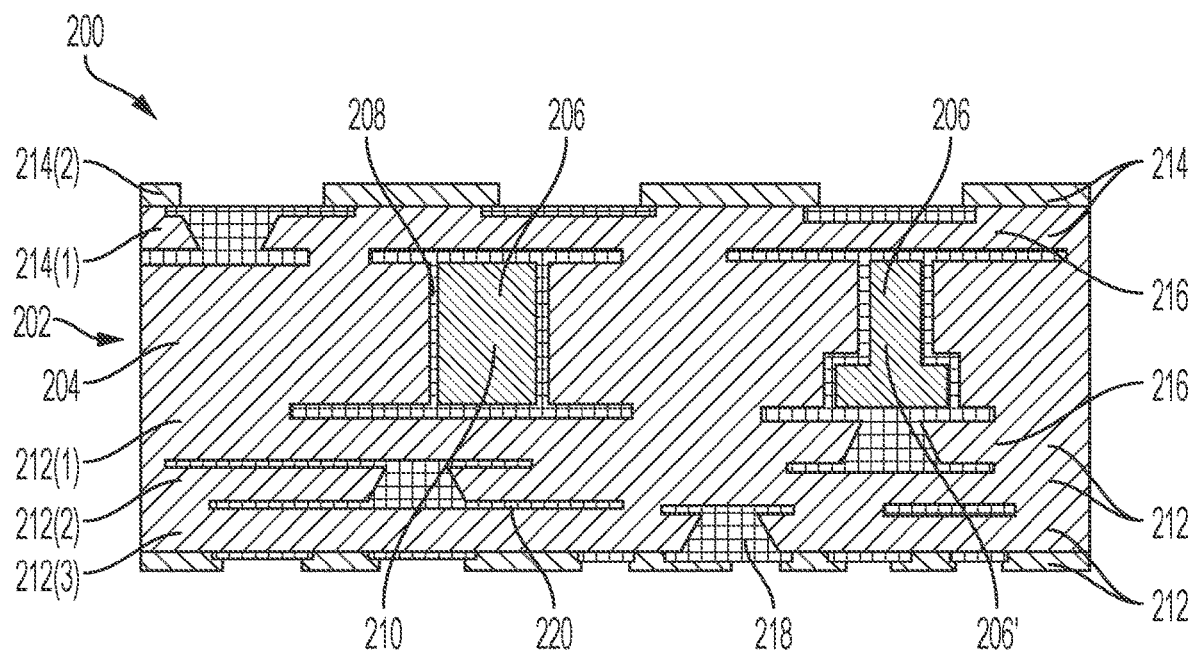
FIG. 2 is an example of an asymmetric electronic substrate, in an example embodiment.

FIG. 2 is an example of an asymmetric electronic substrate 200, in an example embodiment. A core layer 202 includes an insulator 204 and large gauge through holes 206 through the insulator 204, i.e., through holes 206 that are higher gauge than other through holes that may be found in in other routing layers of the asymmetric substrate 200. The through holes 206 are plated with a conductive material 208, such as copper, and optionally filled with a plug 210. The through holes 206 provide capacitance for voltage changes through the asymmetric electronic substrate 200. In contrast to the core layer 102, the core layer 202 is made of substantially the same material and built up in substantially the same way as the routing layers of the asymmetric electronic substrate 200 but include the through holes 206 as described.

The asymmetric electronic substrate 200 further includes topside routing layers 212 and bottom side routing layers 214, the number of topside routing layers 212 not being equal to the number of bottom side routing layers 214. As illustrated, there are more topside routing layers 212 than bottom side routing layers 214, though the designation of topside and bottom side may be arbitrary, and as such the number of bottom side routing layers 214 may be greater than the number of topside routing layers 212. Each routing layer 212, 214 includes a laminated dielectric 216 in which through holes are drilled and filled with a conductive material 218, such as copper, and with conductive traces 220, such as copper traces, positioned on the top or bottom of the dielectric 216.

As noted, the asymmetric electronic substrate 200 is asymmetric because the number of topside routing layers 212 is not equal to the number of bottom side routing layers 214. Thus, while there is a first topside routing layer 212(1) and a first bottom side routing layer 214(1) and a second topside routing layer 212(2) and a second bottom side routing layer 214(2), there is a third topside routing layer 212(3) but not a third bottom side routing layer. In the illustrated example, the core layer 202 is made from two sub-layers, as will be shown in detail herein, though it is to be recognized and understood that the core layer 202 may be made from as few as one layer and as many sub-layers as desired. In an example, the asymmetric electronic substrate 200 includes nine (9) topside layers 212, two (2) sub-layers in the core layer 202, and two (2) bottom side layers 214.

In further contrast to the symmetric electronic substrate 100, the dielectric 216 may, in various examples, be made of the same insulator material as the insulator 204 of the core layer 202. In an example, the insulator 204 and the dielectric 216 are buildup material. In an example, the insulator 204 is photo-imageable dielectric material. In an example, the insulator 204 is dry film resist. Additionally, the through holes 206 are not necessarily straight or otherwise have a regular shape but rather may be stepped or otherwise be irregular, as in the case of the through hole 206'. The process to produce such a through hole 206' will be described in detail herein.

FIGS. 3A-3H illustrate a process of making two asymmetric electronic substrates 200, in an example embodiment. In the example illustrated, the asymmetric electronic substrates 200 each have four (3) topside layers and two (2) bottom side layers 214, though it is to be recognized and understood that any number of topside layers 212 and bottom side layers 214 may be implemented.

Figure 3A:
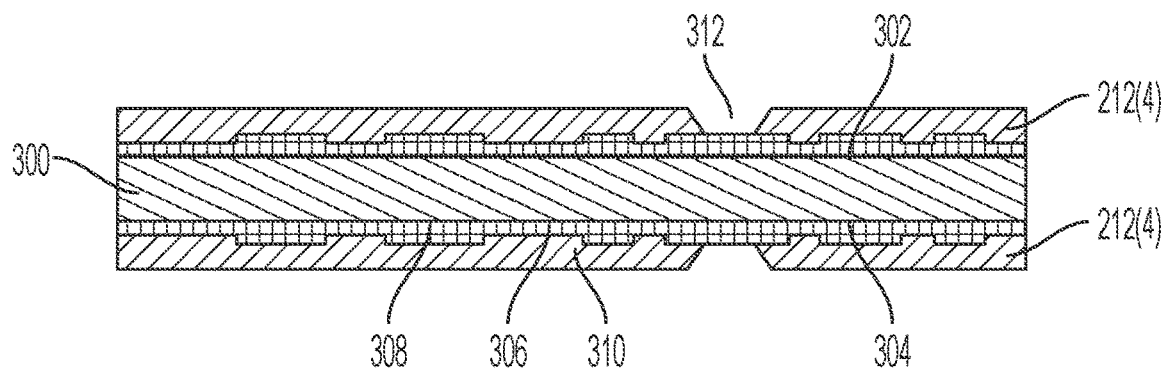
FIGS. 3A-3H illustrate a process of making two asymmetric electronic substrates 200, in an example embodiment.

In FIG. 3A, a separate implementation of the third topside layer 212(3) is formed on each side of a removable carrier layer 300. As such, the third topside layer 212(3) is created twice, once on each major surface 302, 304 of the removable carrier layer 300. In various examples, the removable carrier layer 300 is made from an organic core material, glass, a silicon wafer, or any other suitable material. The organic core material may have copper foil on each of the major surfaces 302, 304.

Forming the third topside layer 212(3) may involve several sub-steps. The sub-steps may be any that are involved in building up an electronic package. For instance, the sub-steps may include plating a conductor, such as copper, on the major surfaces 302, 304 of the removable carrier layer to make a conductive trace 306 and pads 308. A dielectric 310, such as a standard buildup material, may be built up over the conductor Holes for vias 312 may be drilled or otherwise formed in the dielectric 310 and a conductor plated within the holes to form the vias 312.

Figure 3B:
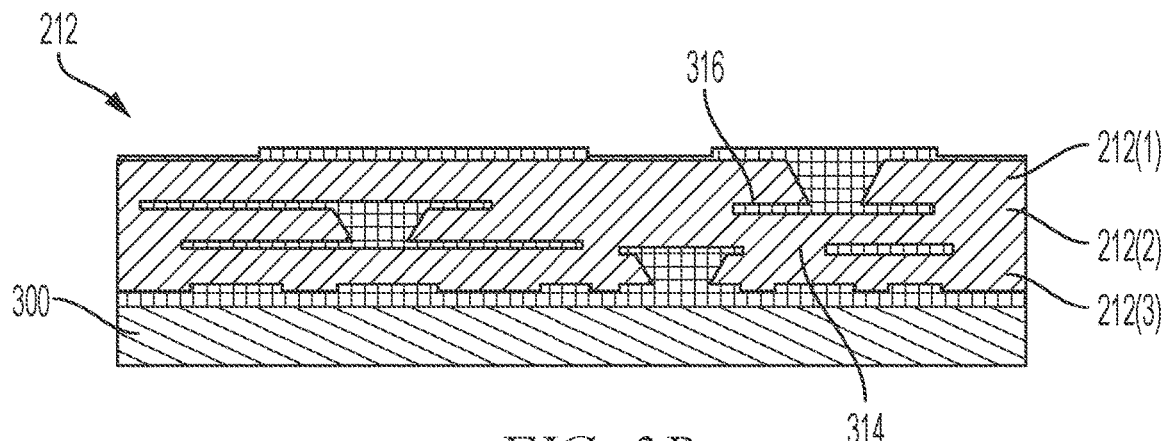

In FIG. 3B, additional topside layers 212 are iteratively and successively formed, one on top of the other, concurrently on each side of the removable carrier layer 300. Thus, following the third topside layer 212(3), a second topside layer 212(2) is formed on the major surface 314 of each of the third topside layers 212(3) according to the sub-steps described with respect to the third topside layer 212(3), including plating a conductor and building up and laminating a dielectric. A first topside layer 212(1) is formed on the major surface 316 of each of the second topside layers 212(2) using the sub-steps, and so forth, until all of the topside layers 212 have been formed. The forming of each of the topside layers 212 may be according to the sub-steps detailed with respect to the fourth topside layer 212(4) above.

Figure 3C:
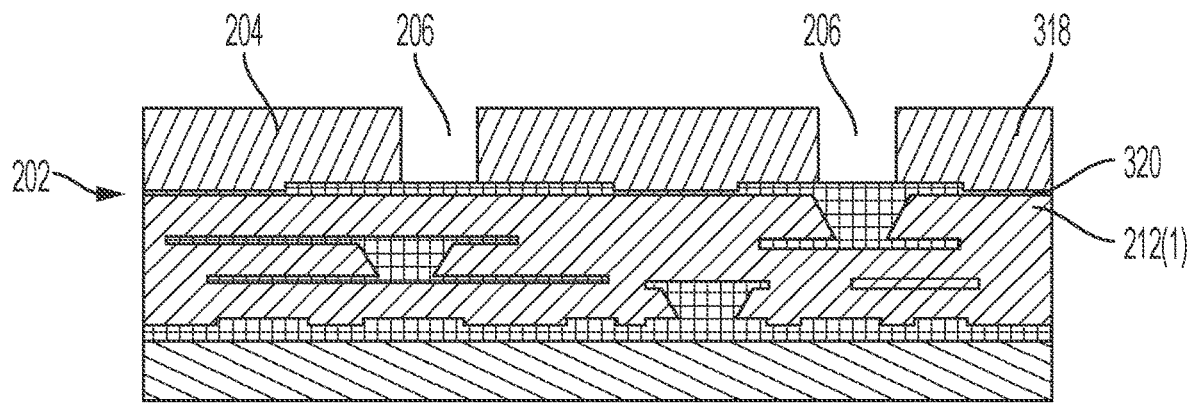

In FIG. 3C, a first sub-layer 318 of the core layer 202 is formed on a major surface 320 of each of the first topside layers 212(1). In one example, the core layer 202 insulator 204 is formed from a photo-imageable dielectric material. In an alternative example, the core layer 202 is formed initially from a dry film resist material that will ultimately be removed and replaced by a molding material as the insulator 204. The through holes 206 are drilled in the first sub-layer 318.

Figure 3D:
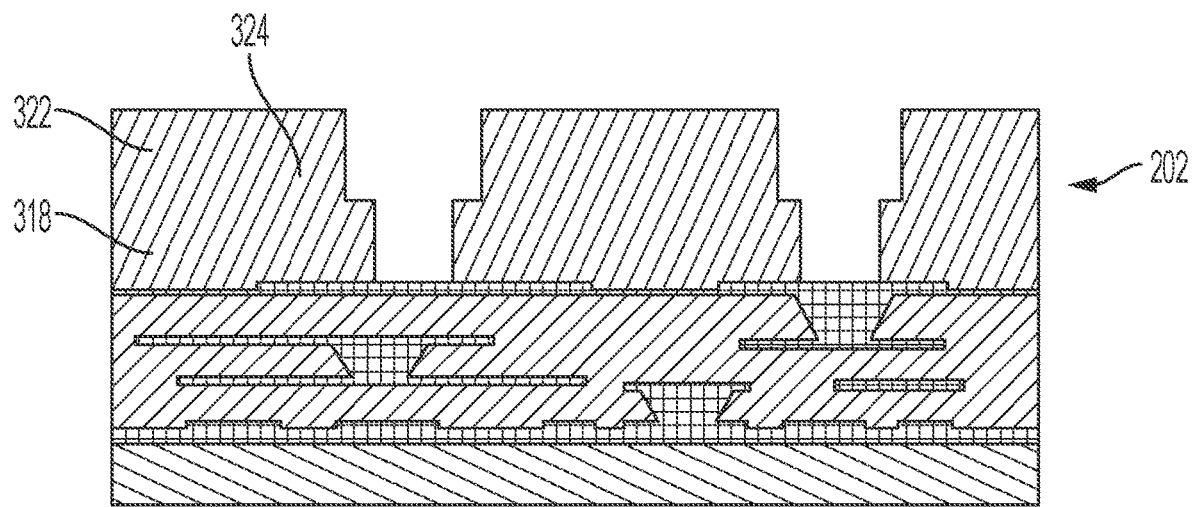

In FIG. 3D, a second sub-layer 322 of the core layer 202 is formed on a major surface 324 of each of the first sub-layers 318, according to the same process as used for the first sub-layers 318.

Figure 3E:
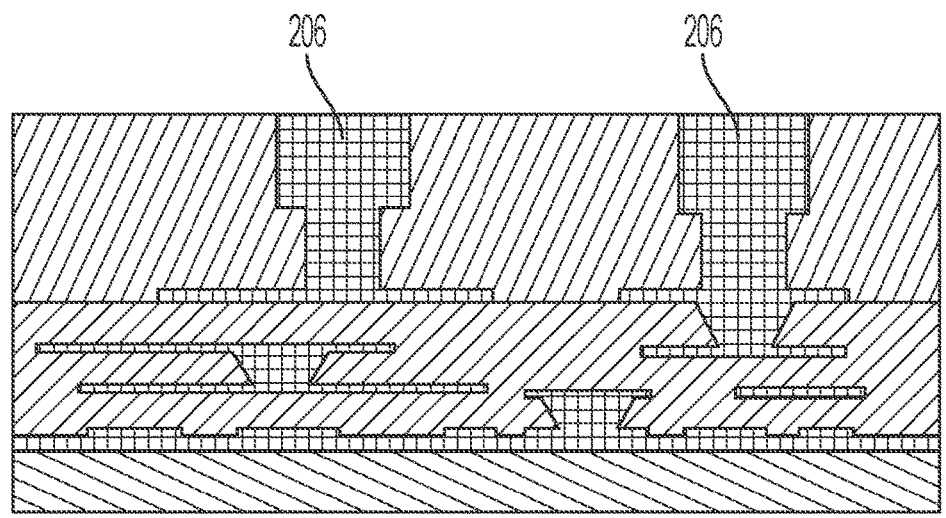

In FIG. 3E, a conductor, such as copper, is plated in each of the through holes 206. Where the through holes 206 are plugged, the plugs 210 (not pictured) may additionally be added.

Figure 3F:
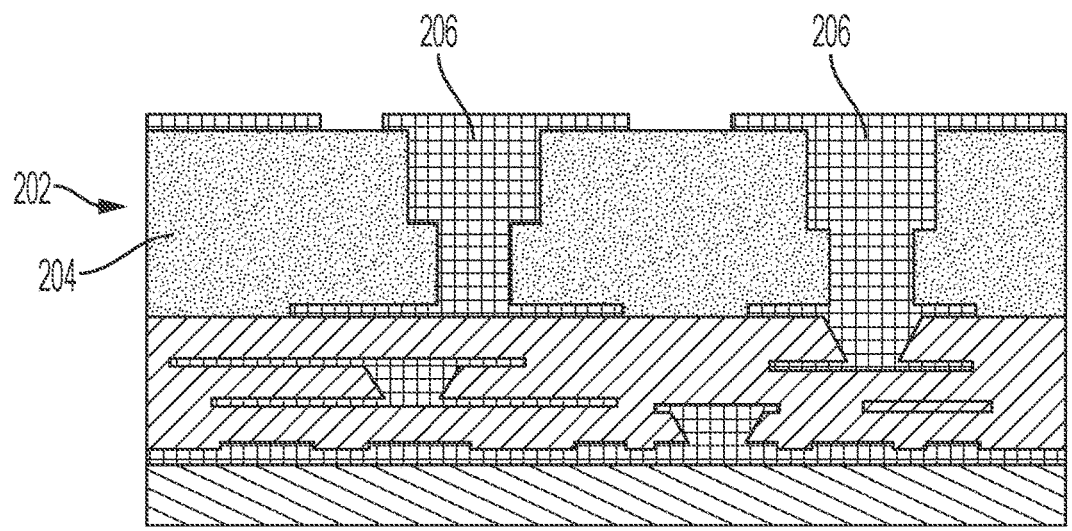

In FIG. 3F, additional steps to form the core layer 202 may be performed. Such steps may include, where the core layer 202 was initially formed with dry film resist, removing the dry film resist and molding a dielectric to form the insulator 204 of the core layer 202 around the through holes 206. This step may be omitted where the core layer 202 was initially formed with a photo-imageable dielectric material. The core layer 202 may be ground and patterned with a conductor 326.

Figure 3G:
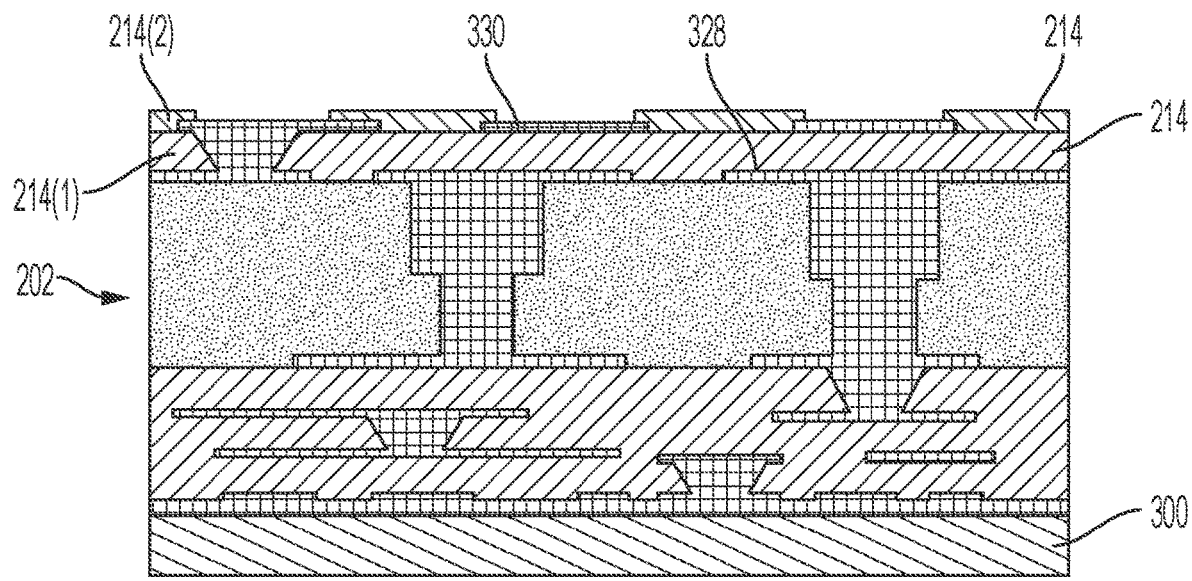
Figure 3H:
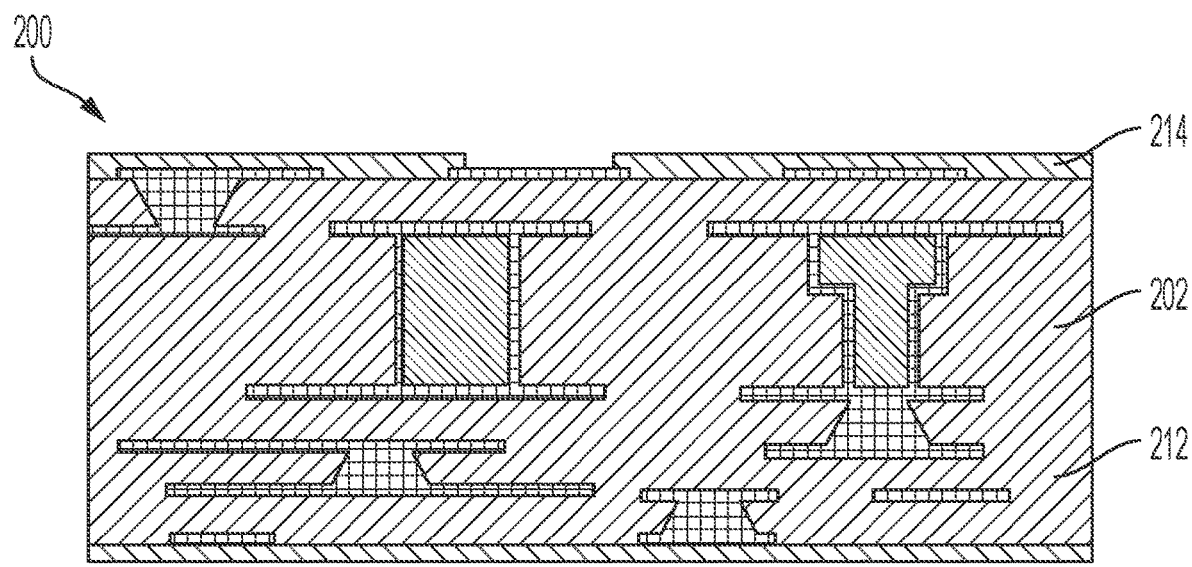
Figure 3H:
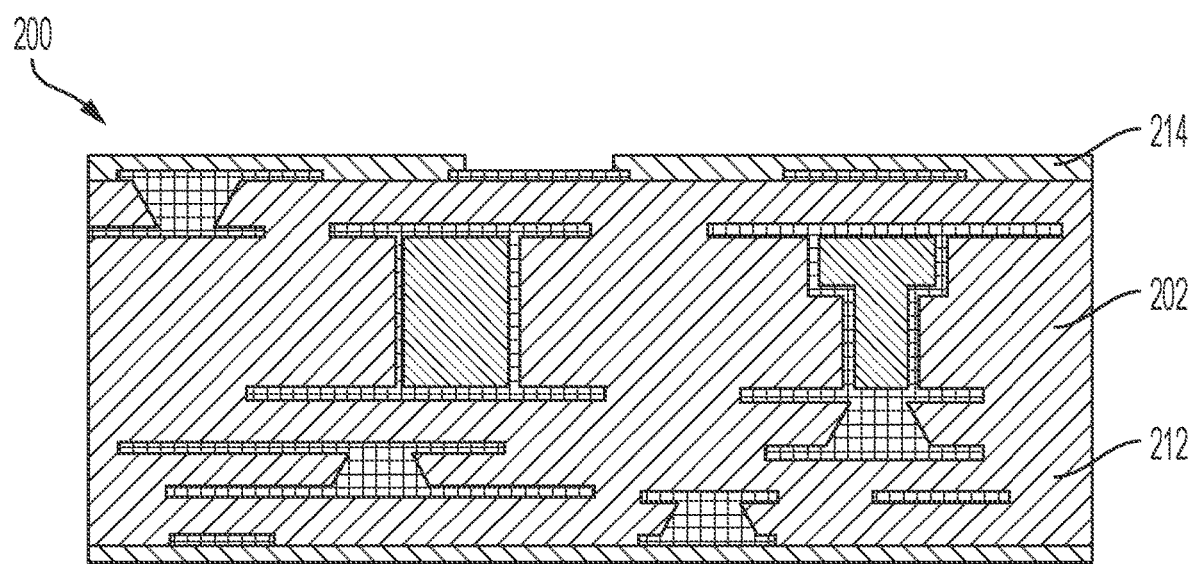

In FIG. 3G, the bottom side layers 214 are iteratively and sequentially formed, one on top of the other, concurrently on each side of the removable carrier layer 300. Thus, a first bottom side layer 214(1) is formed on a major surface 328 of each of the core layers 202 and then a second bottom side layer 214(2) is formed on a major surface 330 of each of the first bottom side layers 214(1). Each of the bottom side layers 214 may be formed according to the sub-steps described with respect to the third topside layer 212(3), including In FIG. 3H, the removable carrier layer 300 is removed, producing two functionally identical asymmetric electronic substrates 200. The removable carrier layer 300 may be removed through a laser exposure process, may be mechanically peeled, or any other suitable process. If a copper foil layer is included on the major surfaces 302, 304, an etching step may optionally be applied to remove the copper foil. While the above process is described for making effectively identical asymmetric electronic substrates 200, it is to be recognized and understood that certain deliberate variations in the asymmetric electronic substrates 200 may be introduced and the asymmetric electronic substrates 200 may not necessarily be identical. However, to conform to the above process, the two asymmetric electronic substrates 200 may be built such that the lamination process for each layer 212, 214 or sub-layer of the core layer 202 is the same at each step so as to prevent warping or otherwise damage the two asymmetric electronic substrates 200. Thus, for instance, provided that heat and any other aspect of the lamination process is applied to each of the two asymmetric electronic substrates 200 at the same time, the two asymmetric electronic substrates 200 may incorporate certain design differences in relation to one another.

FIGS. 4A-4D are depictions of through holes in the core layer 202, in an example embodiment. The through holes illustrated may be utilized as, in addition to, or instead of the through holes 206 of FIG. 2. Moreover, the process of FIGS. 3A-3H, and particularly FIGS. 3C and 3D, may be applied to make asymmetric electronic substrates 200 that include any through hole made according to the principles illustrated in FIGS. 4A-4D. In various examples, the through holes 206 illustrated in FIGS. 4A-4D have a varying width or diameter and are closed at one end, also known as stepped-blind-holes, in contrast to through holes which have substantially straight edges running through the core layer 202 but which are closed at one end, also known as direct-blind-holes.

Figure 4A:
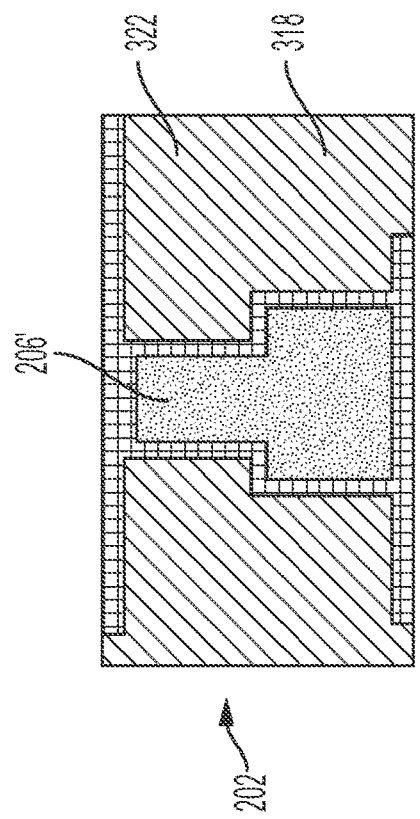
FIGS. 4A-4D are depictions of through holes in the core layer, in an example embodiment.
Figure 4B:
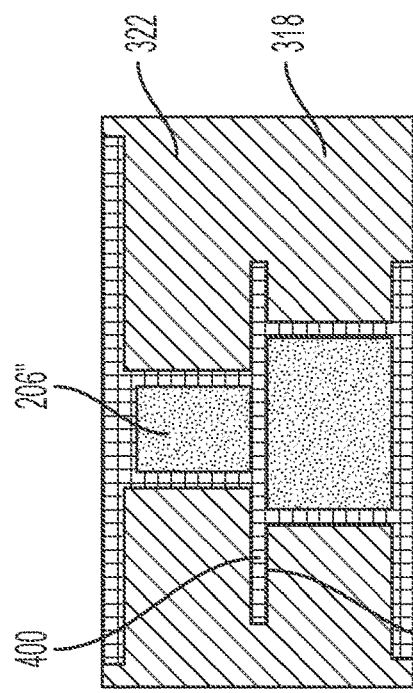
Figure 4C:
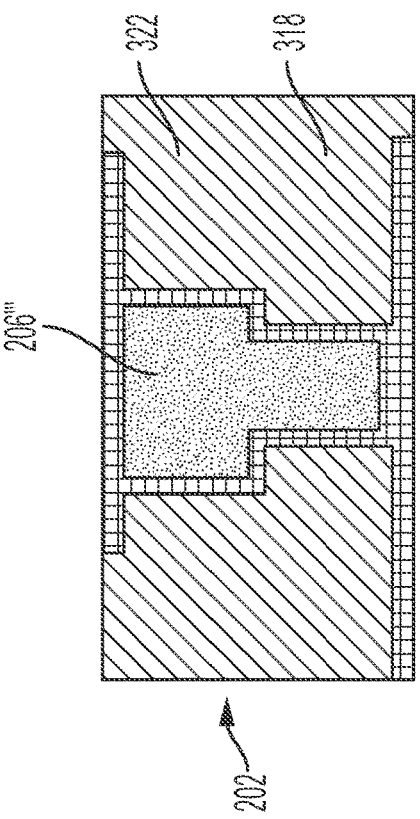
Figure 4D:
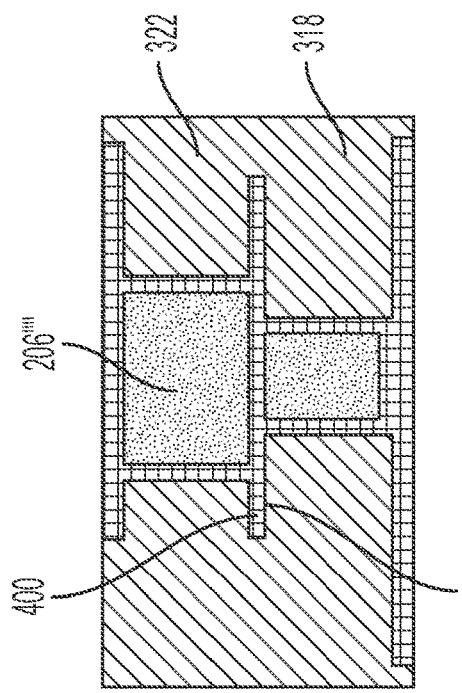

FIG. 4A illustrates the core layer 202 and a through hole 206' in which the through hole 206' as drilled in the first sub-layer 318 is wider than the through hole 206' as drilled in the second sub-layer 322. FIG. 4B illustrates the core layer 202 and a through hole 206" built on the same principles as the through hole 206 except that a conductor 400 is applied to the major surface 324 of the first sub-layer 318. The additional conductor 400 may allow for additional power delivery from the core layer 202, among other effects. FIGS. 4C and 4D illustrate the core layer 202 with through holes 206''' and 206'''', respectively, made with the inverse process as the through holes 206' and 206", respectively. Thus, the through hole 206''' in the first sub-layer 318 is narrower than the through hole 206''' in the second sub-layer 322.

Figure 5:
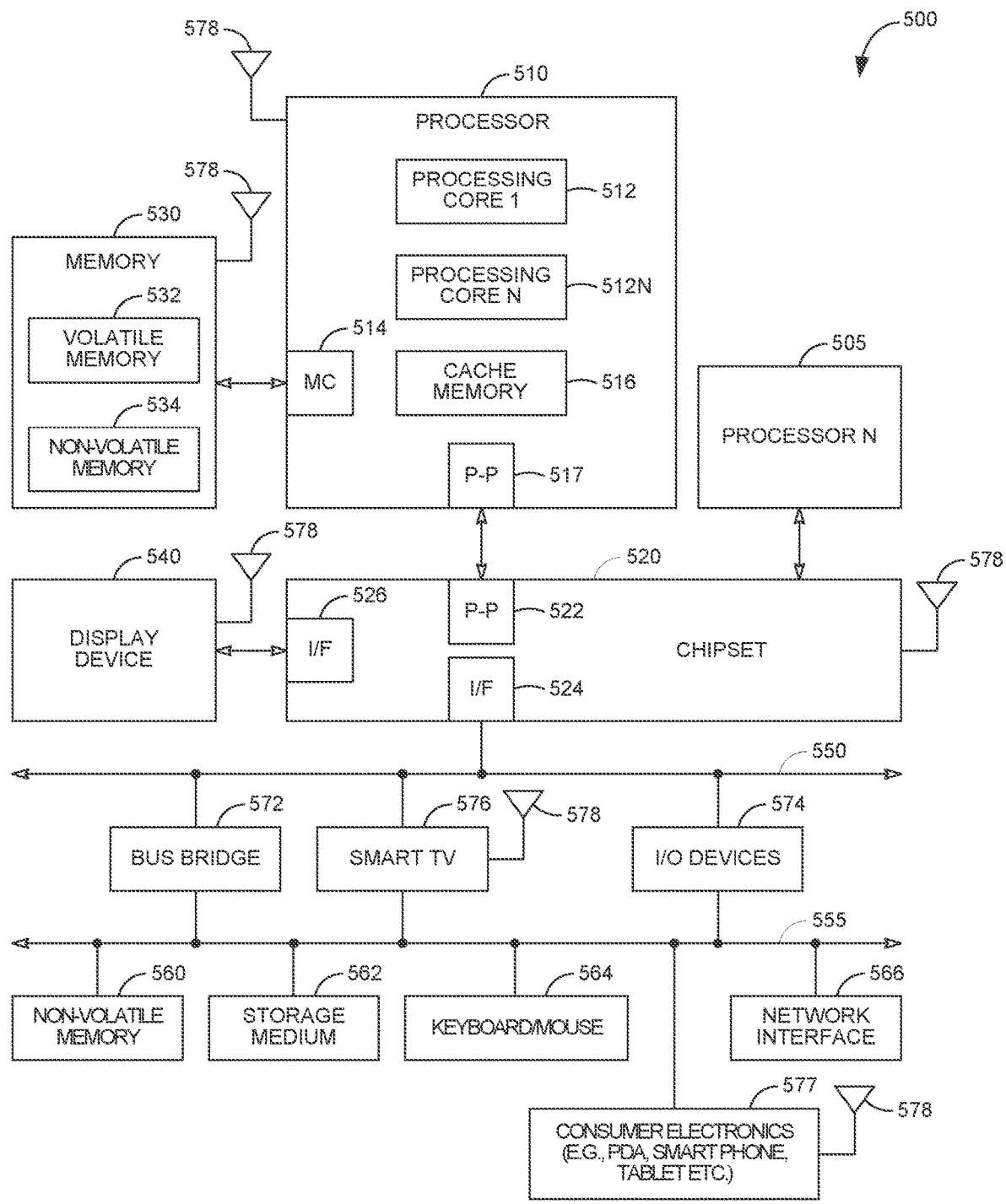
FIG. 5 illustrates a system level diagram, depicting an example of an electronic device (e.g., system) including an electronic chip, in an example embodiment.

FIG. 5 illustrates a system level diagram, depicting an example of an electronic device (e.g., system) including any of the electronic packages 100, 200, 700, in an example embodiment. FIG. 5 is included to show an example of a higher-level device application for the electronic packages 100, 200, 700. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 575 to communicate with any device configured to transmit and/or receive wireless signals. In one embodiment, an interface for wireless antenna 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the example system, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices, including a bus bridge 572, a smart TV 576, I/O devices 574, nonvolatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 may be interconnected together via a bus bridge 572.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

Figure 6:
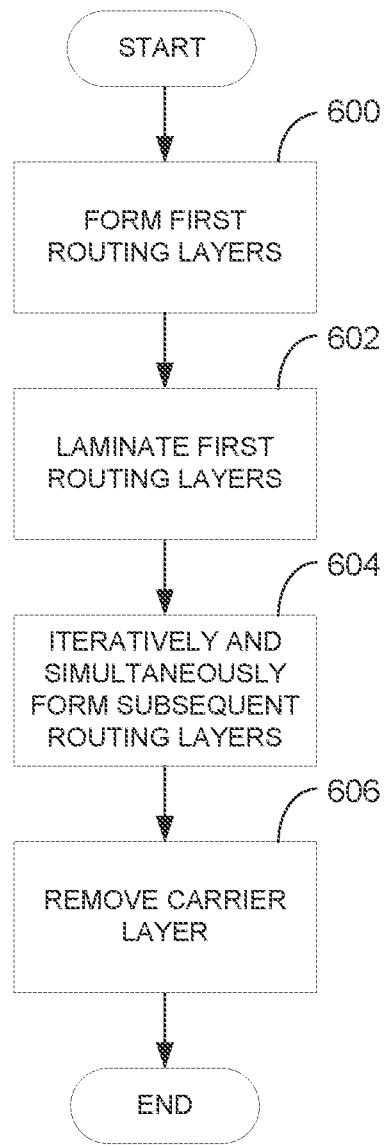
FIG. 6 is a flowchart for making an asymmetric electronic substrate, in an example embodiment.

FIG. 6 is a flowchart for making an electronic assembly, in an example embodiment. The electronic assembly may be any of the electronic packages 100, 200, 700, or any other suitable electronic assembly.

At 600, a first layer is formed on each opposing major surface of a removable carrier layer, the first layer being a first routing layer.

At 602, the first routing layers are laminated simultaneously.

At 604, subsequent layers are iteratively and simultaneously built up and laminated on layers previously formed and laminated on the removable carrier layer, the subsequent routing layers including routing layers and a core layer formed on each side of the removable carrier layer between other ones of the subsequent routing layers, the core layer formed between ones of the subsequent routing layers, the core layer including through holes having a larger gauge than through holes included in the routing layers, wherein a number of layers on a first side of the core layer, between the core layer and the carrier layer, is different than a number of layers on a second side of the core layer.

In an example, forming the at least one core layer comprises forming blind hole through holes in an insulator material. In an example, forming the blind hole through holes forms direct-blind through holes and comprises applying a photo-imageable dielectric material, drilling through holes into the photo-imageable dielectric material, plating a conductive material inside the through holes, filling a void in the through holes as plated with a polymer material, and grinding a top of the photo-imageable dielectric material.

In an example, forming the blind hole through holes forms stepped-blind through holes and comprises applying a dry film resist material, drilling through holes into the dry film resist material, plating a conductive material inside the through holes, filling a void in the through holes as plated with a polymer material, removing the drive film resist material, applying a molding material around the through holes as plated, and grinding a top of the molding material and through holes.

In an example, forming the blind hole through holes forms stepped-blind through holes and comprises applying a dry film resist material, drilling through holes into the dry film resist material, plating a conductive material inside the through holes, filling a void in the through holes as plated with a polymer material, removing the drive film resist material, applying a molding material around the through holes as plated, and grinding a top of the molding material and through holes.

In an example, forming the subsequent layers comprises applying a dielectric on each major surface of a structure including the removable carrier layer and routing layers previously formed on the removable carrier layer, laminating the dielectric, drilling through holes in the dielectric, and plating a conductive material in the through holes.

At 606, the removable carrier layer is removed to produce two asymmetric substrates, each asymmetric substrate including at least one core layer. In an example, the number of layers on the first side exceeds the number of layers on the second side. In an example, the number of layers on the second side is two.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
   a first electronic substrate, comprising:
   a core having a first major surface, a second major surface opposite the first major surface, and a plurality of through holes forming a plurality of vias, at least one of the plurality of through holes being a stepped-blind through hole and at least one of the plurality of through holes including a plug positioned therein;
   a topside structure, comprising a first plurality of routing layers, secured to the first major surface; and
   a bottomside structure, comprising a second plurality of routing layers different than the first plurality of routing layers, secured to the second major surface;
   a second electronic substrate, comprising:
   a core having a first major surface, a second major surface opposite the first major surface, and a plurality of through holes forming a plurality of vias, at least one of the plurality of through holes being a stepped-blind through hole and at least one of the plurality of through holes including a plug positioned therein;
   a topside structure, comprising a first plurality of routing layers, secured to the first major surface; and
   a bottomside structure, comprising a second plurality of routing layers different than the first plurality of routing layers, secured to the second major surface; and
   a removable carrier layer positioned between and in contact with the topside structure of the first electronic substrate and the topside structure of the second electronic substrate.

2. The apparatus of claim 1, wherein the core of the each of the first and second electronic substrates includes an insulator material forming the plurality of through holes.

3. The apparatus of claim 2, wherein the plurality of through holes include a direct-blind through hole.

4. The apparatus of claim 1, wherein a number of the first plurality of routing layers exceeds a number of the second plurality of routing layers on each of the first and second electronic substrates.

5. The apparatus of claim 4, wherein the number of the second plurality of routing layers is two.

6. The apparatus of claim 1, wherein each of the routing layers comprises a laminated dielectric with through holes formed therein.

7. The apparatus of claim 1, wherein the stepped-blind through hole includes the plug.

8. The apparatus of claim 1, wherein at least one of the plurality of through holes in the core of the each of the first and second electronic substrates includes a conductor extending horizontally through the through hole.

9. The apparatus of claim 8, wherein the core of the each of the first and second electronic substrates includes an insulator material having a first sub-layer and a second sub-layer and the conductor is applied to a major surface of the first sub-layer.

10. The apparatus of claim 9, wherein each of the plurality of through holes are plated with a conductive material and wherein the conductor is electrically coupled to the conductive material.

* * * * *